US012703906B2

(12) United States Patent
Draken

(10) Patent No.: US 12,703,906 B2
(45) Date of Patent: Aug. 11, 2026

(54) EVAPORATION BOAT

(71) Applicant: KENNAMETAL INC., Latrobe, PA (US)

(72) Inventor: Alexander Draken, Schongau (DE)

(73) Assignee: KENNAMETAL INC., Latrobe, PA (US)

(*) Notice: Subject to any disclaimer, the term of this patent is extended or adjusted under 35 U.S.C. 154(b) by 1068 days.

(21) Appl. No.: 17/841,207

(22) Filed: Jun. 15, 2022

(65) Prior Publication Data

US 2022/0403502 A1 Dec. 22, 2022

(30) Foreign Application Priority Data

Jun. 16, 2021 (DE) ........................ 102021115602.5

(51) Int. Cl.
*C23C 14/24* (2006.01)
*C23C 14/06* (2006.01)

(52) U.S. Cl.
CPC ........ *C23C 14/243* (2013.01); *C23C 14/0647* (2013.01)

(58) Field of Classification Search
None
See application file for complete search history.

(56) References Cited

U.S. PATENT DOCUMENTS 2,962,538 A * 11/1960 Paul ...................... C23C 14/243 392/389
3,514,575 A * 5/1970 Passmore ................ C23C 14/26 392/389
3,515,852 A * 6/1970 Steinitz ................... C23C 14/26 392/389
3,636,305 A * 1/1972 Passmore .............. C23C 14/243 392/389
3,724,996 A * 4/1973 Montgomery ........ C04B 35/583 432/264
4,089,643 A * 5/1978 Jerabek ................... C23C 14/26 266/275
4,446,357 A * 5/1984 Barshter .................. H05B 3/10 392/389

(Continued)

FOREIGN PATENT DOCUMENTS

EP 3470545 A1 4/2019
JP 2008169458 A 7/2008

(Continued)

OTHER PUBLICATIONS

May 25, 2024 Foreign Office Action Chinese Application No. CN202210676290.6, P21-06506-CN-NP, 2 pages.

*Primary Examiner* — Thor S Campbell
(74) *Attorney, Agent, or Firm* — Christopher J. Owens

(57) ABSTRACT

The invention relates to an evaporation boat comprising an evaporator body, wherein the evaporator body comprises an evaporator surface which extends along a longitudinal direction of the evaporator body. The evaporator surface has a pyramidally structured surface which can be created by mechanically machining the evaporator surface in two mutually perpendicular machining directions. The pyramidally structured surface comprises a plurality of structural elements which are directly adjacent to one another and have a substantially rectangular bottom surface and lateral surfaces which taper conically to a top surface or point.

17 Claims, 3 Drawing Sheets

(56) References Cited

U.S. PATENT DOCUMENTS

| | | | | | |
|---|---|---|---|---|---|
| 5,368,882 | A * | 11/1994 | Tran | G01T 1/20 | 427/255.39 |
| 5,460,980 | A * | 10/1995 | Tran | G21K 4/00 | 427/257 |
| 5,494,499 | A * | 2/1996 | Nordlander | C23C 14/243 | 75/686 |
| 6,085,025 | A * | 7/2000 | Seifert | C23C 14/243 | 392/389 |
| 6,120,286 | A * | 9/2000 | Goetz | C23C 14/243 | 266/275 |
| 7,494,616 | B2 * | 2/2009 | Rusinko, Jr. | C23C 14/243 | 266/286 |
| 12,247,282 | B2 * | 3/2025 | Guo | C23C 14/26 | |
| 2006/0115243 | A1 | 6/2006 | Jeong et al. | | |
| 2006/0223020 | A1 * | 10/2006 | Goetz | C23C 14/243 | 432/261 |
| 2007/0110412 | A1 * | 5/2007 | Rusinko, Jr. | C23C 14/243 | 392/388 |
| 2008/0245305 | A1 | 10/2008 | Ikarashi et al. | | |
| 2011/0013891 | A1 * | 1/2011 | Nurnberger | C23C 14/243 | 392/388 |
| 2017/0022600 | A1 * | 1/2017 | Grau | B01B 1/005 | |
| 2020/0290315 | A1 * | 9/2020 | Hiramatsu | C23C 14/28 | |
| 2021/0238730 | A1 * | 8/2021 | Draken | C23C 14/243 | |
| 2023/0104601 | A1 * | 4/2023 | Draken | C23C 14/26 | 427/248.1 |

FOREIGN PATENT DOCUMENTS

| | | | |
|---|---|---|---|
| WO | 2021009711 | A1 | 1/2021 |
| WO | 2022038548 | A1 | 2/2022 |

* cited by examiner

EVAPORATION BOAT

RELATED APPLICATION DATA

The present application claims priority pursuant to 35 U.S.C. § 119(a) to German Patent Application Number 102021115602.5 filed Jun. 16, 2021, which is incorporated herein by reference in its entirety.

FIELD

The invention relates to an evaporation boat comprising an evaporator body, wherein the evaporator body comprises an evaporator surface. The invention also relates to a method for producing such an evaporation boat and to the use of the evaporation boat for evaporating metal in a metallization system.

BACKGROUND

So-called vacuum band metallization using PVD (physical vapor deposition) technology is a common method for coating flexible substrates with metals. The flexible substrate can be plastic film, metal foil, membranes or paper, for example. The most commonly used metal for coating substrates is aluminum. Substrates coated by means of PVD technology are widely used for packaging or decorative purposes. In addition to decorative purposes, the coating can in particular be used as surface protection or thermal insulation.

The evaporation of metals onto flexible substrates takes place in metallization systems. The substrate to be coated is passed over cooled rollers in the form of a long band, in the course of which the substrate is exposed to a metal vapor which is deposited on the substrate as a thin metal layer. To generate the metal vapor, it is common to use evaporation boats. These are heated to temperatures of approximately 1700° C. using a direct passage of current. A metal wire, for example aluminum, is guided onto the preheated evaporation boat and first liquefies on a surface of the evaporation boat as a molten mass (about 650° C.). It is then converted into the gas phase to form of a metal vapor and coats the flexible substrate. The entire metallization process takes place in a vacuum, typically in a vacuum chamber at a negative pressure of approximately $10^{-4}$ mbar, which ensures controlled evaporation of the metal.

A common problem in practice is the wetting of the surface of the evaporation boat with the liquefied metal. At the beginning of the evaporation process, only a small portion of the surface is wetted, which results in a low evaporation rate (kilograms of metal per unit time) of the metal. Uneven wetting of the surface furthermore results in uneven wear of the evaporation boat. Hot metal is highly corrosive in the liquid state and reacts with the surface of the evaporation boat, which results in damage to said boat. Consequently, chemical corrosion shortens the life time or service life of the evaporation boat in operation. In order to be able to reliably ensure a constant vapor flow, evaporation boats typically have to be replaced after a few operating hours.

A variety of different ways to improve the wettability of the metal on the surface can be found in the prior art. One possible way to achieve this is to modify the surface of the evaporation boat.

EP 1 688 514 A1 describes a ceramic evaporation boat that comprises an evaporator surface for evaporating metals. The evaporator surface is provided with a plurality of grooves. The grooves are disposed not parallel to the applied current direction and have a width of 0.1 to 1.5 mm, a depth of 0.03 to 1 mm and a length of at least 1 mm. The cross-section of the grooves is rectangular. The grooves can also cross, so that they form at least one intersection. This makes it possible to achieve a complex pattern on the evaporator surface, for example circular, elliptical, rhombohedral, rectangular, radial or lattice-like. The pattern preferably occupies at least 10% of the surface of the evaporation side. The grooves can be produced by mechanical machining, sandblasting or water jet cutting. The evaporation boats provided with grooves are in particular expected to exhibit improved wetting behavior and higher corrosion resistance. This is explained by the so-called capillary effect, which “pulls” the liquid aluminum that is in the grooves during evaporation toward the longitudinal ends of the grooves and is thus expected to improve the wetting of the surface. At the same time, there is additional reflection of thermal radiation on the side walls of the grooves. This is in turn expected to lead to an increased temperature of the evaporator surface and thus enable a higher evaporation rate.

U.S. Pat. No. 2,962,538 discloses a evaporating element comprising a structured surface for improving the wettability of the surface. The structuring is achieved with a plurality of grooves. The grooves can extend parallel to one another and can intersect. According to one embodiment, the grooves can be configured as a “diamond pattern” with a checkerboard-like crossing of the grooves, wherein the grooves are provided with a rectangular cross-section. According to another embodiment, a trapezoidal arrangement of the grooves is described. In cross-section, the grooves in this embodiment have a needle-like configuration. The structuring of the surface is intended to lead to better wettability with the liquid metal, which is likewise explained by the capillary forces acting on the molten metal along the longitudinal direction of the grooves.

One disadvantage of the prior art lies in the preferred direction of the grooves. If the point of contact on the evaporator surface comprising longitudinally configured grooves, for example, of a metal wire which is brought into contact is not in the center of said surface, the liquid metal is pulled apart unevenly on the evaporator surface by the capillary forces, because the liquid metal expands along the grooves on both sides at the same speed. This can lead to uneven wetting. This results in uneven heat distribution within the evaporation boat, because liquid metal accumulates at one location on the evaporator surface, which locally increases the electrical resistance and with it the temperature. Higher temperatures of the liquid metal intensify its corrosive properties and therefore lead to short service lives of the evaporation boats. In practice, therefore, the flow of current through the evaporation boat has to be adjusted accordingly, which leads to expensive additional work.

Another way to improve wettability is described in DE 10 2008 016 619 B3. This patent discloses an evaporation boat that includes an evaporator surface comprising a plurality of depressions. The depressions are preferably configured with circular or circular ring-shaped openings. The depressions are supposed to have a wetting-promoting effect, primarily by changing a wetting angle at an edge between the sidewall of the depression and an adjacent evaporator surface. It is therefore possible for the point of contact of the metal wire to not be in a center of the evaporator surface and not cause uneven wetting.

SUMMARY

The underlying object of the invention is to provide an evaporation boat having higher evaporation rates and thus a longer service life.

The object is solved according to the invention by an evaporation boat according to Claim 1.

Advantageous embodiments of the evaporation boat according to the invention are specified in the subclaims, which can optionally be combined with one another.

To achieve the object, an evaporation boat comprising an evaporator body is provided, wherein the evaporator body comprises an evaporator surface which extends along a longitudinal direction of the evaporator body. The evaporator surface has a pyramidally structured surface which can be created by mechanically machining the evaporator surface in two mutually perpendicular machining directions. The pyramidally structured surface comprises a plurality of structural elements which are directly adjacent to one another and have a substantially rectangular bottom surface and lateral surfaces which taper conically to a top surface or point.

The evaporation boat according to the invention can be heated by direct passage of current to such an extent that a metal wire, for example an aluminum wire, which is brought into contact liquefies on the pyramidally structured surface of the evaporator surface and evaporates at a low ambient pressure, in particular in a metallization system. The pyramidally shaped evaporator surface holds the molten mass of the liquefied metal until it evaporates into the gas phase.

In contrast to the structuring of the surface of an evaporation boat by incorporating grooves as described in the prior art, the surface area available for evaporating a metal can be increased simply and cost-effectively by the pyramidal configuration of the evaporator surface. As a result, the evaporation boat is a structured heating element with an enlarged surface area for evaporation.

The greater surface area enables a longer service life of the evaporation boat in operation with an unchanging evaporation rate. Alternatively, it is possible to set an unchanging service life in operation and a higher evaporation rate. The choice between the two modes of operation advantageously enables a situation-dependent setting of the evaporation process. On the one hand, a longer service life and thus cost-effective process control can be selected, and, on the other hand, accelerated process control can be ensured by a higher evaporation rate.

The pyramidally structured surface also allows improved wettability of the structured evaporator surface with the liquefied metal. As a result of the two machining directions, the structuring comprises one or more depressions along which the liquefied metal can be distributed on the evaporator surface. This distribution is supported by the so-called capillary effect, which "pulls" the metal along the depressions to the ends of the depressions. Because the machining directions are perpendicular to one another, no preferred direction develops on the surface. Homogeneous wetting of the surface can thus be ensured.

The improved wettability of the evaporator surface which results from the structuring of the surface provides a homogeneous temperature distribution within the evaporation boat. This can also ensure better cooling of the evaporation boat. Poor wettability, on the other hand, leads to a local accumulation of aluminum and thus to higher local resistance with a local temperature increase and the accompanying increased corrosion.

The pyramidal structuring of the surface can be produced by milling, for example. The two machining directions mentioned can thus be milling directions. One machining direction preferably includes a plurality of parallel milling directions. An existing evaporator body can therefore be simply and cost-effectively reworked or modified to produce the evaporator body according to the invention. If the evaporator body is produced by sintering and hot pressing a green body, the pyramidally structured surface can also be produced prior to the sintering and hot pressing of the green body, in particular by embossing the structuring into the green body.

In one embodiment, the opposite lateral surfaces of two adjacent structural elements span an external angle of 85-95°, preferably about 90°, because this provides a particularly efficient opening angle of the lateral surfaces, wherein the opening angle is defined as an angle that is subtended between a lateral surface and a surface perpendicular to the evaporator surface. Such an opening angle is about 45° and promotes a homogeneous formation of metal vapor on the lateral surfaces of the structural elements. A uniform formation of metal vapor is a basic requirement for the homogeneous coating of substrates.

According to another embodiment, the top surface or point of the structural element can have a height relative to its rectangular bottom surface of 0.5-4 mm, preferably 0.6-1.5 mm, particularly preferably 0.8-1.2 mm. Structural elements configured in this way promote efficient flow of the molten metal around the structural elements and thus allow even wetting of the surface.

In another embodiment, the bottom surface of the structural elements is substantially square. It is thus possible to achieve a particularly homogeneous evaporation of the metal from the evaporator surface.

The length of one side of the substantially square bottom surface corresponds to a distance between two points or centers of two adjacent structural elements, wherein the distance has a length of 1-8 mm, preferably 3-6 mm, particularly preferably 4-5 mm. This symmetry relationship results from the mutually perpendicular machining directions. This creates a highly symmetrical and periodic arrangement of structural elements on the evaporator surface. The symmetry can be described as cubic and therefore has no preferred direction along a specific direction on the surface which, in the worst case, would lead to inhomogeneous wetting of said surface.

According to the invention, the two mutually perpendicular machining directions extend in straight lines without interruptions, because this makes it possible to ensure a good wettability of the liquefied metal on the evaporator surface. The evaporator surface of the evaporation boat can thus be produced with a particularly small amount of effort.

It is advantageous for the pyramidally structured surface to have a surface area that is at least 5%, preferably 10%, particularly preferably 15% larger than the evaporator surface prior to mechanical machining. It is thus possible to set a higher evaporation rate with unchanging service life in operation or an unchanging evaporation rate with a longer service life in operation.

In another embodiment, the evaporation boat can be heated by direct passage of current as a resistance. Due to the structured surface and the associated uniform wetting by the liquid metal, the evaporation boat forms a uniform electrical resistance because the development of a parallel resistance as a result of local accumulations of liquid metal on the evaporator surface is reduced.

According to a further embodiment, the evaporation boat can be made of a sintered ceramic material selected from the group consisting of $TiB_2$—BN, TiB2—BN—AlN and TiB2—BN—AlN—W. Typically, a mixture consisting of an electrically conductive component such as titanium diboride and an electrically insulating component, for example boron nitride and/or aluminum nitride or tungsten, is used, which is formed into a green body and then hot-pressed and sintered. It is possible to set specific electrical heating resistances of 600-6000 μOhm·cm depending on the mixing ratio of conductive and non-conductive component of 50 wt % each (+/−10 wt %).

The invention also relates to a method for producing an evaporation boat comprising a pyramidally structured surface. The method comprises the following steps:

a) providing an evaporation boat having an evaporator body, wherein the evaporator body comprises an evaporator surface;
b) mechanically machining the evaporator surface in two mutually perpendicular machining directions using a groove milling cutter with a V-shaped cutting insert and thus creating the pyramidally structured surface.

It is thus possible to produce such structured surfaces with a particularly small amount of effort. An existing evaporator surface can thus be simply and cost-effectively reworked or modified to produce the evaporator surface according to the invention. The pyramidal structuring according to the invention can be created in the surface in a particularly simple manner by using a V-shaped cutting insert. The use of the two mutually perpendicular machining directions likewise ensures mechanical milling with little effort, because the evaporation boats do not have to be aligned using a specific machining angle, which is time-consuming.

The V-shaped cutting insert in particular has a cutting edge angle of 90°. This makes it particularly easy to produce a pyramidal structured surface, in which the opposite lateral surfaces of two adjacent structural elements have an external angle of 85-95°.

If the evaporator body is produced by sintering and pressing a green body, the pyramidally structured surface can also be produced prior to the sintering and pressing of the green body, in particular by embossing a pyramidal pattern into the green body mass.

The evaporation boat having a pyramidally structured surface can also be used for evaporating metal in a PVD metallization system. Such an apparatus is described in DE 10 2004 047 938 A1, for example.

BRIEF DESCRIPTION OF THE DRAWINGS

Further advantages and features will emerge from the following description and from the accompanying drawings. The figures show.

DETAILED DESCRIPTION

Figure 1:
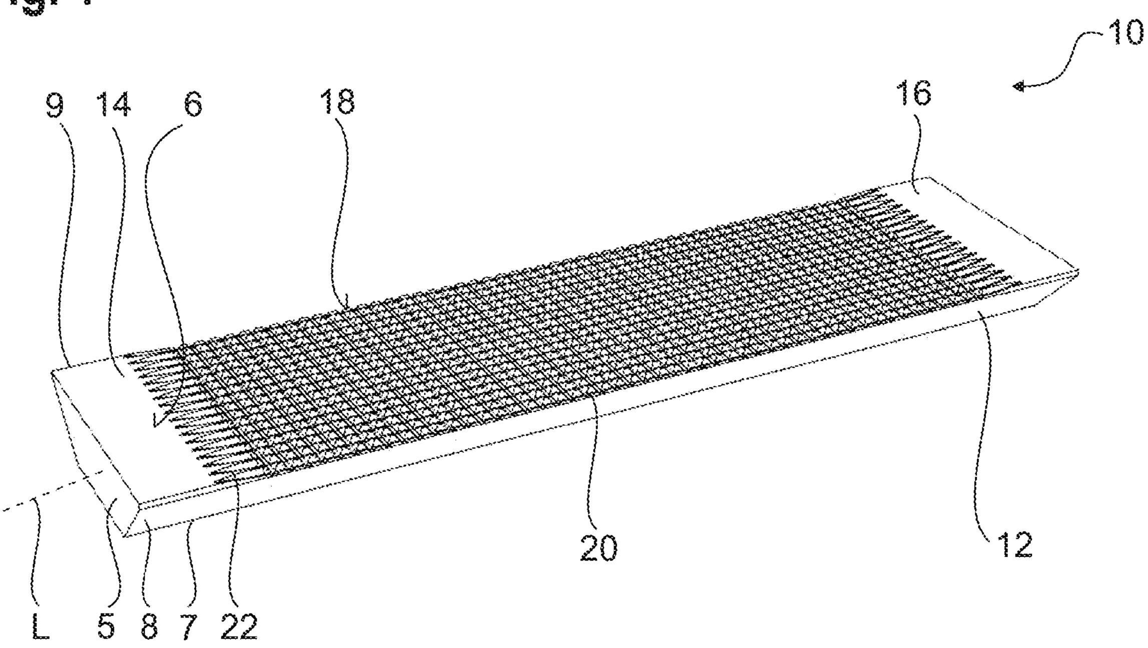
FIG. 1 in a perspective view, the evaporation boat according to the invention comprising a pyramidally structured surface, FIG. 2 in a plan view, the evaporation boat of FIG. 1, FIG. 3 in a plan view, a pyramidally structured region of the evaporation boat of FIG. 1, FIG. 4 in a plan view, an intersection and four structural elements of the evaporation boat of FIG. 1, FIG. 5 in a sectional view along the section line V, the evaporation boat of FIG. 1.
Figure 2:
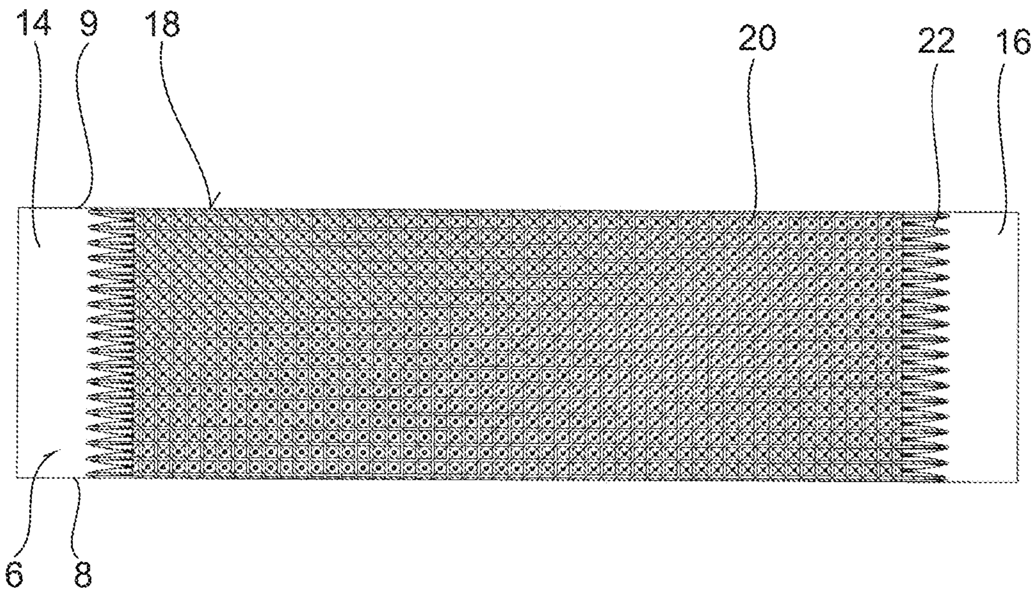

FIGS. 1 and 2 show an evaporation boat 10 which extends along a longitudinal axis D and comprises an evaporator body 12 and a first clamping end 14 and a second clamping end 16 which adjoin the end faces of the evaporator body 12 in one piece in the direction of the longitudinal axis L.

The evaporation boat 10 has the basic shape of a cylinder having an isosceles trapezium as the base surface 5.

Such a body can also be described as a regular prism, i.e., a straight prism having a regular polygon as the bottom surface.

In the illustrated embodiment, the evaporator body 12 can have the basic shape of a regular prism, while the first and the second clamping end 14, 16 can have any shape. The evaporation boat 10 comprises an evaporator surface 18 which extends along the evaporator body 12 and is flush with the clamping ends 14, 16.

It is also possible to provide the evaporation boat with a plurality of evaporator surfaces. This can be achieved in that the evaporator body 12 has a rotational symmetry, wherein the evaporator body can comprise a number of evaporator surfaces which corresponds to the order of rotational symmetry. Such an evaporation boat is known from DE 10 2020 102 483.5 (not published), for example.

In the shown embodiment, the evaporator surface 18 is delimited only by the edge 22 of the clamping ends 14, 16. However, it is also conceivable for the evaporator surface 18 to be delimited by further elements, in particular by a raised edge or rim. It is also conceivable for the evaporator surface 18 to be delimited by a depression. The delimitation can be in the direction of the longitudinal axis L or perpendicular to it, in the transverse direction of the evaporator surface. However, it is also in line with the invention if the evaporator surface 18 is not delimited and merges flat into the clamping ends 14, 16.

The first clamping end 14 and the second clamping end 16 are preferably configured identically. The configuration of the two clamping ends 14, 16 is explained in the following using the first clamping end 14 as an example.

In an alternative embodiment, the first clamping end 14 and the second clamping end 16 can of, course, be configured differently from one another.

In the shown embodiment, the clamping end 14 has the same basic shape as the adjacent evaporator body 12, namely a cylinder having an isosceles trapezium as the base surface 5.

The sides, which represent the lateral surface of the cylinder, respectively form two opposite outer surfaces 8, 9, an underside 7 and an upper side 6 of the clamping end 14, which merges flat into the adjacent evaporator surface 18 of the evaporator body 12.

The evaporator surface 18 has a pyramidally structured surface 20. In the shown embodiment, the pyramidally structured surface 20 extends over the entire evaporator surface 18. The pyramidally structured surface 20 can in principle occupy any size portion of the evaporator surface 18. In another embodiment, the pyramidally structured surface 20 can occupy at least 50% of the evaporator surface 18, preferably at least 70%, particularly preferably at least 90%. Here, it is conceivable that the pyramidally structured surface 20 can occupy any regions on the evaporator surface 18. These can form contiguous, i.e., connected, regions or be separated from one another by unstructured regions. The thus created pattern of the evaporator surface 18 can have circular, elliptical, rhombohedral, rectangular, radial or lattice-like shapes, for example.

Figure 3:
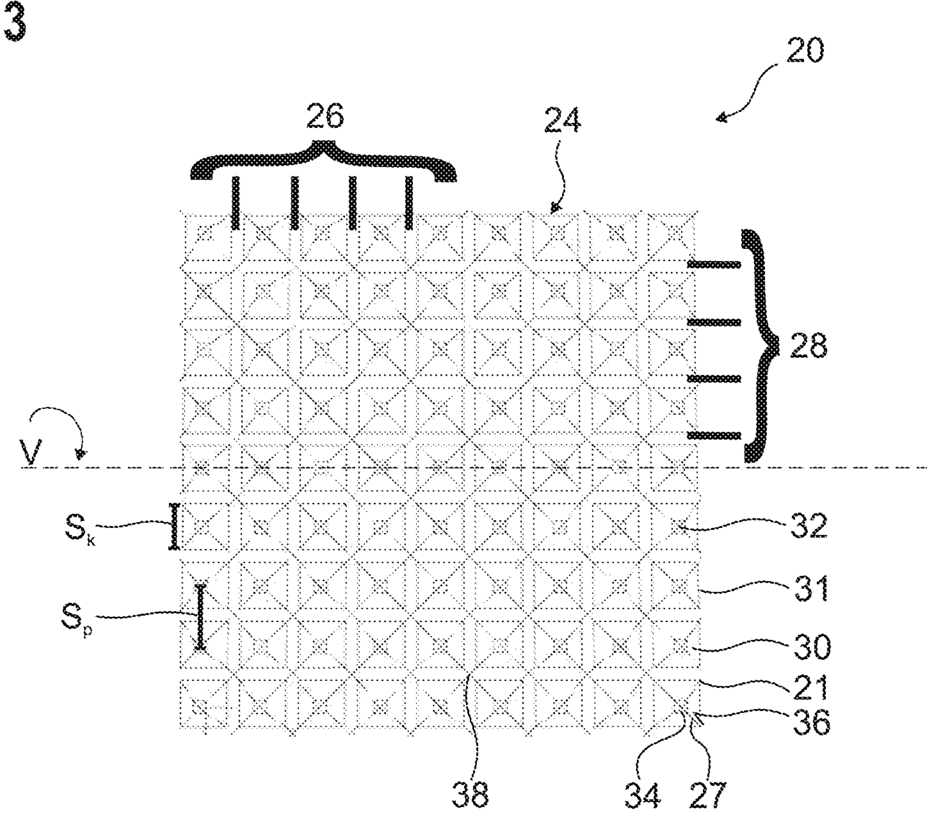

FIG. 3 shows a plan view of a subsection of the pyramidally structured surface 20. The pyramidally structured surface 20 comprises a periodic arrangement of a plurality of structural elements 24 which are directly adjacent to one another. The position and shape of the structural elements 24 is predetermined by the two mutually perpendicular machining directions, which form a first set of parallel depressions 26 and a second set 28 of parallel depressions, wherein the first set 26 and the second set 28 are perpendicular to one another. According to the invention, any number of depressions can form a first or a second set.

The depressions 26, 28 within the first and second set in particular always have the same distance from one another. The distance between the depressions 26 within the first set is preferably approximately equal to the distance between the depressions 28 within the second set.

The first set and second set of parallel depressions 26, 28 form the structural elements 24 of the pyramidally structured surface 20. Due to the symmetry-related predetermination of the machining directions, the structural elements 24 have a substantially rectangular, preferably square bottom surface 30. The substantially square bottom surface 30 is formed by four sides 31 having identical dimensions, each of which is at right angles to the other, wherein each two sides 31 meet at a substantially right-angled corner 21. Each bottom surface 30 of a structural element 24 therefore has four sides 31 having identical dimensions and four substantially right-angled corners 21. One of four lateral surfaces 36 respectively extends over each one of the four sides 31, wherein the lateral surfaces 36 are all congruent with one another. The lateral surfaces 36 can be conical and converge with the other lateral surfaces 36 to a point 32. In this embodiment, the structural element 24 forms the shape of a pyramid having burrs 27 which are rounded as a result of machining. According to another embodiment, the point 32 can be rounded, or flattened and configured as a top surface 34 so that the structural elements 24 then have the shape of truncated pyramids with rounded burrs 27. For the invention, it is irrelevant whether the structural element 24 has a top surface 34 or a point 32.

It is also conceivable for the configuration of the bottom surface to be exactly square. The lateral surfaces can likewise converge linearly to a top surface 34 or a point 32.

The structural elements 24 are directly adjacent to one another with the sides 31 of the substantially square bottom surfaces 30, i.e., two opposite sides 31 of two respective opposite bottom surfaces 30 each are connected to one another via one of the depressions 26, 28 such that the sides 31 are flush with one another with their respective ends. The two mutually perpendicular machining directions thus extend in straight lines without interruptions.

Figure 4:
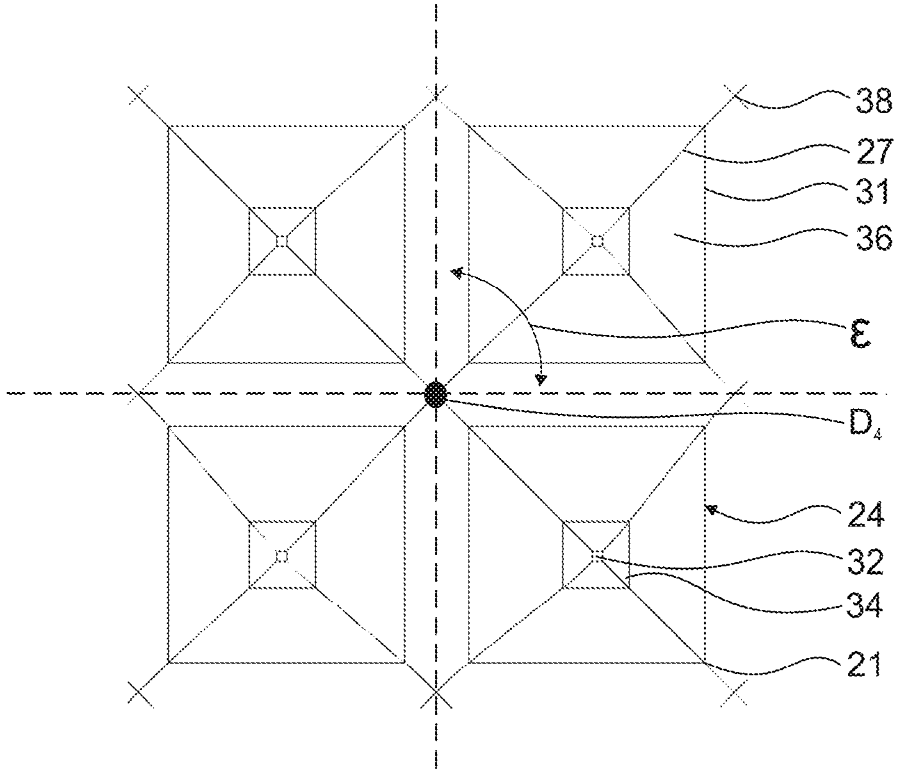

The structural elements 24 form a highly symmetrical cubic arrangement with the first set of depressions 26 and second set of depressions 28. This arrangement is shown in FIG. 4 and will be described in the following.

The first set of depressions 26 and the second set of depressions 28 intersect at a right angle at a plurality of intersections 38. Each corner 21 of a structural element 24 abuts a respective intersection 38. Consequently, four respective corners 21 of four structural elements 24 meet at one intersection 38. This results in a cubic periodicity of structural elements 24 and intersections 38, i.e., each intersection 38 has a four-fold axis of rotation perpendicular to the evaporator surface 18. Therefore, four structural elements 24 are symmetrically connected at an intersection 38 via a four-fold axis of rotation $D_4$, wherein a 90° rotation (angle $\varepsilon$) about said axis transforms the structural elements 24 into one another.

Due to the cubic symmetry, the length $S_K$ of a side 31 of the substantially square bottom surface 30 corresponds to a distance $S_P$ between two points or centers of two adjacent structural elements 24.

Figure 5:
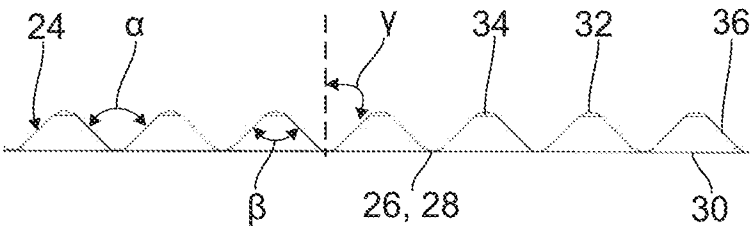

According to a preferred embodiment, the opposite lateral surfaces 36 of two adjacent structural elements 24 span an external angle $\alpha$ of 85-95°, in particular about 90° (see FIG. 5). Due to the pyramidal symmetry, the internal angle $\beta$ associated with the point 32 or the top surface 34 between two opposite lateral surfaces 36 within a structural element 24 likewise has a range of 85-95°. The opening angle $\gamma$, which corresponds to half of the angle $\alpha$ or $\beta$, is accordingly about 45°.

In another embodiment, the top surface 34 or point 32 of a structural element 24 has a height relative to its square bottom surface 30. The height preferably has a length of 0.5-4 mm, preferably 0.6-1.5 mm, particularly preferably 0.8-1.2 mm.

The evaporation boat 10 can act as an electrical heating resistance and be made of a corresponding material and can then be heated by direct passage of current by applying an electrical voltage.

A method for producing the pyramidal structured surface according to the invention will be described in the following. The evaporation boat can be formed from a green body mass and then hot-pressed and sintered. The thus obtained evaporation boat has an evaporator body comprising an evaporator surface. By mechanically machining the evaporator surface in two mutually perpendicular machining directions, the evaporator surface can be partially or completely converted into the pyramidal structured surface according to the invention. The mechanical machining can be carried out using a V-shaped cutting insert. The use of a grinder is conceivable as well. The mechanical machining of the evaporator surface can therefore include milling or grinding. It is consequently possible to produce such a structured surface retroactively and to modify existing evaporation boats.

In another embodiment, the pyramidally structured surface can be created directly in the green body mass, for example by embossing the shape using a stamp. The structuring of the surface can thus be carried out prior to the sintering of the evaporation boats.

Evaporation boats produced in this manner have a larger surface area than evaporation boats that have not been machined.

A surface area comparison between an evaporation boat prior to mechanical machining comprising a correspondingly "smooth" evaporator surface and an evaporation boat according to the invention after mechanical machining comprising a pyramidally structured surface will be shown in the following.

The evaporator surface of both evaporation boats includes a rectangular area having the dimensions 35×100 mm. The "smooth evaporator surface" of the evaporation boat of the prior art therefore has a surface area of about 3500 $mm^2$. A structuring of the same 35×100 mm area with a pyramidal structured surface results in a surface area of 4143 $mm^2$. This corresponds to an increase in the surface area of 643 $mm^2$ or 18.4%. In this embodiment, the side length of the structural elements is about 2 mm and the height is about 1 mm, with an opening angle $\gamma$ of about 45°. In an alternative embodiment, any dimensions can be used, as a result of which increases in the surface area can be adjusted as needed.

Such an increased surface area enables either a higher evaporation rate with unchanging service life or an unchanging evaporation rate with longer service lives. The evaporation rate can be measured with little effort by gravimetrically determining the quantity of metal deposited using piezo sensors. A change in the service life of the evaporation boats can be determined via the penetration depth of the corrosion in the evaporator body. For this purpose, the service lives of evaporation boats comprising pyramidally structured and "smooth" surfaces can be compared with one another.

The invention is not limited to the shown embodiment. Individual features of one embodiment can in particular be combined as desired with features of other embodiments, in particular independently of the other features of the respective embodiments.

LIST OF REFERENCE SIGNS

Base surface 5
Upper side 6
Underside 7
Outer surfaces 8, 9
Evaporation boat 10
Evaporator body 12
First clamping end 14
Second clamping end 16
Evaporator surface 18
Pyramidally structured surface 20
Corner 21
Edge 22
Structural element 24
First set of parallel depressions 26
Burr 27
Second set of parallel depressions 28
Bottom surface 30
Sides 31
Point 32
Top surface 34
Lateral surface 36
Intersection 38
Axis of rotation $D_4$
Longitudinal axis L
External angle $\alpha$
Internal angle $\beta$
Opening angle $\gamma$
Right angle $\varepsilon$
Length $S_K$
Distance $S_P$

The invention claimed is:

1. An evaporation boat comprising an evaporator body, wherein the evaporator body comprises an evaporator surface which extends along a longitudinal direction of the evaporator body, wherein the evaporator surface has a pyramidally structured surface which is created by mechanically machining the evaporator surface in two mutually perpendicular machining directions, wherein the pyramidally structured surface comprises a plurality of structural elements which are directly adjacent to one another and have a substantially rectangular bottom surface and lateral surfaces which taper conically to a top surface or point, wherein the opposite lateral surfaces of two adjacent structural elements span an external angle $\alpha$ of 85-95°.

2. The evaporation boat according to claim 1, wherein the top surface or point of the structural element has a height relative to its substantially rectangular bottom surface of 0.5-4 mm.

3. The evaporation boat according to claim 1, wherein the structural elements have a substantially square bottom surface.

4. The evaporation boat according to claim 1, wherein the length $S_K$ of one side of the substantially rectangular bottom surface corresponds to a distance $S_P$ between two points of two adjacent structural elements, wherein the distance $S_P$ has a length of 1-8 mm.

5. The evaporation boat according to claim 1, wherein the two mutually perpendicular machining directions extend in straight lines without interruptions.

6. The evaporation boat according to claim 1, wherein the pyramidally structured surface has a surface area that is at least 5% larger than the evaporator surface prior to mechanical machining.

7. The evaporation boat according to claim 1, wherein the evaporation boat can be heated by direct passage of current as a resistance.

8. The evaporation boat according to claim 1, wherein the evaporation boat is made of a sintered ceramic material selected from the group consisting of $TiB_2$—BN, $TiB_2$—BN—AlN and $TiB_2$—BN—AlN—W.

9. The evaporation boat according to claim 1, wherein the external angle $\alpha$ is about 90°.

10. The evaporation boat of according to claim 2, wherein the height relative to the substantially rectangular bottom surface is 0.6-1.5 mm.

11. The evaporation boat of according to claim 2, wherein the height relative to the substantially rectangular bottom surface is 0.8-1.2 mm.

12. The evaporation boat according to claim 4, wherein the distance $S_P$ has a length of 3-6 mm.

13. The evaporation boat according to claim 4, wherein the distance $S_P$ has a length of 4-5 mm.

14. The evaporation boat of claim 6, wherein the surface area is at least 10 percent larger than the evaporator surface area prior to mechanical machining.

15. A method for producing an evaporation boat comprising a pyramidally structured surface according to claim 1, wherein the method comprises the following steps:

providing an evaporation boat having an evaporator body, wherein the evaporator body comprises an evaporator surface;

mechanically machining the evaporator surface in two mutually perpendicular machining directions using a groove milling cutter with a V-shaped cutting insert and thus creating the pyramidally structured surface.

16. Use of an evaporation boat having a pyramidally structured surface according to claim 1 for evaporating metal in a PVD metallization system.

17. The evaporation boat according to claim 1, wherein the plurality of structural elements have a substantially rectangular bottom surface and lateral surfaces which taper conically to a top surface.

* * * * *